Aug. 30, 1966 R. N. MELLOTT ET AL 3,270,215
TIMING CIRCUIT
Filed Sept. 10, 1964

INVENTORS
ROBERT N. MELLOTT
PAUL F. SMITHA
BY Arthur Freilich
ATTORNEY

United States Patent Office 3,270,215
Patented August 30, 1966

3,270,215
TIMING CIRCUIT

Robert N. Mellott and Paul F. Smitha, Los Angeles, Calif., assignors to The Bunker-Ramo Corporation, Canoga Park, Calif., a corporation of Delaware Filed Sept. 10, 1964, Ser. No. 395,447
7 Claims. (Cl. 307—88.5)

This invention relates generally to electronic circuit improvements and more particularly to a circuit arrangement responsive to an input signal for providing a fast rise time output pulse after a predetermined interval.

Many applications exist where it is desirable to introduce a delay or at least to precisely define a fixed time interval. For example, in the timing circuits of data processing systems, it is often necessary to provide an output pulse at the end of a fixed time interval initiated in response to an input signal. One technique for establishing this fixed time interval is to use a generator providing a ramp output signal where the ramp duration defines the desired interval. Inasmuch as ramp signal generators are relatively simple and inexpensive, this technique is particularly attractive and is thus often employed. Problems arise, however, where this technique is used in very high speed equipment because of the difficulties encountered in detecting the end of the ramp, or, in other words, the terminal value of the signal. The reason for the difficulty, of course, is that the relatively slow rise or fall time of the ramp signal is usually too slow to produce switching in a sensing circuit.

In view of the foregoing, it is an object of the present invention to provide a circuit arrangement for detecting the precise time at which a rising or falling signal reaches its maximum or minimum value.

It is a more particular object of this invention to provide circuit means for use in combination with a ramp voltage generator for detecting the time at which the generator output reaches a terminal value.

Most ramp voltage generators utilize a capacitor coupled to a switch for developing a ramp output signal which corresponds either to the capacitor charging or discharging voltage. In accordance with the invention, the capacitor is connected in a first circuit branch connected in parallel with a second circuit branch. Both circuit branches are fed by a substantially constant current source. While the capacitor is being charged or discharged in response to the actuation of the switch, little current flows through the second circuit branch. However, as soon as the capacitor becomes fully charged or discharged, current is diverted into the second circuit branch to trigger an output circuit which provides a pulse having a fast rise or fall time and which is suitable for switching a sensing circuit.

In a preferred embodiment of the invention, a ramp voltage generator is provided which includes a first transistor. A first current path including a capacitor is connected in series with the emitter-collector path of the first transistor. A second current path including a small resistor is connected to the base of the first transistor. The terminals of both the resistor and the capacitor remote from the first transistor are connected together and through a resistor to a source of potential. The base-emitter junction of a second transistor is connected across the small resistor. When the first transistor is cut off, the capacitor terminal connected thereto is at a first reference potential while the capacitor-resistor junction is held at a second reference potential. When the second reference potential is removed from the junction, the first transistor turns on permitting the capacitor to discharge therethrough to generate the ramp output signal. After the capacitor is discharged, an increased current will be diverted through the small resistor to thus turn the second transistor on and provide a fast rising output pulse.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
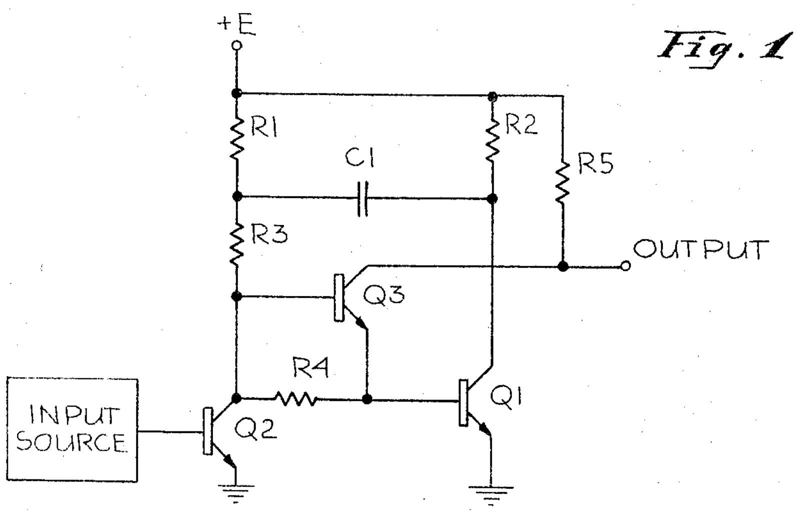
FIGURE 1 is a schematic diagram of a preferred circuit arrangement in accordance with the invention.

Attention is now called to FIGURE 1 of the drawings which illustrates a preferred circuit arrangement constructed in accordance with the present invention. The circuit includes a first transistor switch Q1 which is of the NPN type. The emitter thereof is connected to a first source of reference potential, herein illustrated as ground. The collector thereof is connected through a capacitor C1 and a resistor R1 to a second source of reference potential, herein represented as +E. In addition, the collector of transistor Q1 is connected through resistor R2 to the second source of reference potential. The base of transistor Q1 is connected through serially connected resistors R3 and R4 to the junction between capacitor C1 and resistor R1.

A second transistor Q2, also of the NPN type, is provided for selectively clamping the junction between resistors R3 and R4. The emitter of transistor Q2 is connected to the first source of reference potential while the collector thereof is connected to the junction between the resistors R3 and R4. The base of transistor Q2 is connected to an input source.

An output circuit comprising a third transistor Q3, also of the NPN type, is provided. The base-emitter junction of transistor Q3 is connected across resistor R4. Resistor R5 connects the collector of transistor Q3 to the second source of reference potential. The collector of transistor Q3 serves as the circuit output terminal.

As previously noted, the function of the circuit of FIGURE 1 is to provide an output pulse having a fast rise time, at the end of a fixed time interval initiated in response to an input signal. The operation of the circuit of FIGURE 1 will be explained with reference to the waveforms illustrated in FIGURE 2.

When the input source applies a positive potential to the base of transistor Q2, transistor Q2 will conduct and thus clamp the junction between resistors R3 and R4 at approximately ground potential. As a consequence, the base of transistor Q1 will also be held close to ground, thus holding transistor Q1 off. The potential at the collector of transistor Q1 will thus be close to the value of the second reference potential +E. The value of resistor R1 is intended to be substantially greater than the values of resistors R3 and R4 and thus the potential at the junction between resistor R1 and capacitor C1 will be close to ground. Thus, a potential drop substantially equal to +E will exist across the capacitor. There will be virtually no potential drop across the resistor R4 and thus the transistor Q3 will be cut off.

In order to initiate the fixed time interval, the signal applied by the input source to the base of transistor Q2 is driven to ground or below to thereby cut off transistor Q2. When transistor Q2 is cut off, there is nothing to hold transistor Q1 off and thus current flow is initiated therethrough. More particularly, capacitor C1 is permitted to discharge through the collector-emitter path of transistor Q1. The discharging current through capacitor C1 will, of course, also exist in the resistor R1.

The potential at the junction between the resistor R1 and capacitor C1, which was formerly close to ground, will not vary much, inasmuch as it cannot rise substantially above the diode drop across the base-emitter junction of transistor Q1. Thus, inasmuch as the potential at the junction between resistor R1 and capacitor C1 cannot vary substantially, the resistor R1 can be considered as a constant current source which initially applies current to the capacitor C1 to discharge it when the transistor Q1 is turned on. Since this current is substantially constant, the potential at the collector of transistor Q1 will decrease substantially linearly as shown in line (*b*) of FIGURE 2. When the capacitor C1 is fully discharged or in other words reaches its terminal value, the constant current conducted through the resistor R1 will then be diverted through the resistors R3 and R4 into the base of transistor Q1. The increased potential drop across resistor R4 will be sufficient to forward bias transistor Q3 to initiate a current from the second source of reference potential through resistor R5 to the base of transistor Q1. Accordingly, the potential on the collector of transistor Q3 will fall to approximately ground.

Inasmuch as there is virtually no capacitance in the emitter-collector path of transistor Q3, the rise time of the output signal on the collector thereof will be extremely fast and will thus be suitable for switching a sensing circuit to indicate the precise time at which the ramp voltage at the collector of transistor Q1 reaches its terminal value. When the input source subsequently applies a positive potential to the base of transistor Q2 to forward bias it, insufficient base current will remain to keep transistor Q1 on. Accordingly transistor Q1 will cut off as will transistor Q3 whose base-emitter junction will no longer be forward biased. The collector of transistor Q1 will then quickly rise to a potential of +E and the capacitor C1 will again be charged prior to the development of a subsequent ramp signal. The values of the resistor R1 and capacitor C1 of course determine the slope of the ramp voltage. The resistor R3 functions to maintain the junction between resistor R1 and capacitor C1 at a substantially constant voltage level before and after transistor Q2 is turned off.

Figure 3:
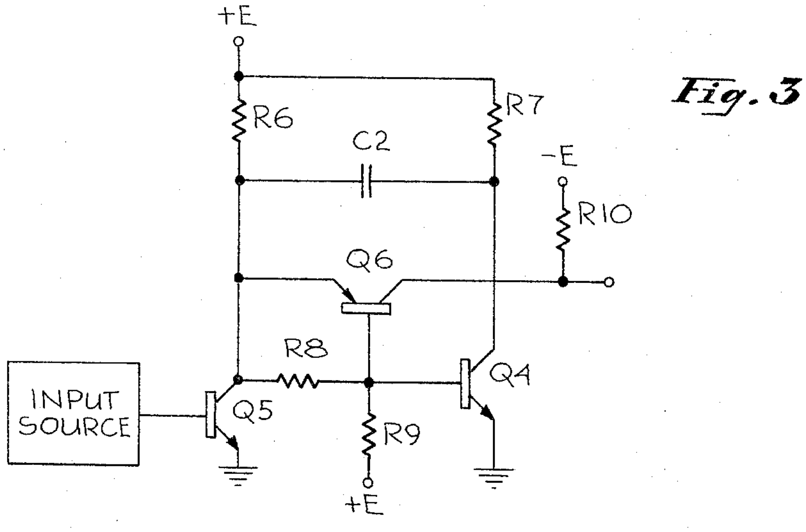
FIGURE 3 is a schematic diagram of an alternative form of the invention.
Figure 2:
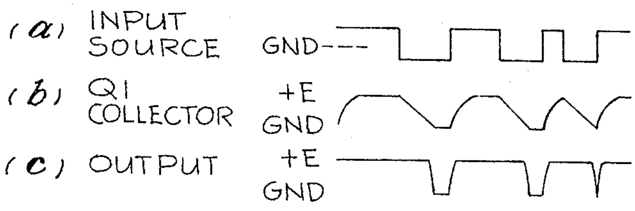
FIGURE 2 is a waveform chart illustrating signals occurring at various points in the circuit of FIGURE 1.

Attention is now called to FIGURE 3 which illustrates an alternative embodiment of the invention which is similar to that previously discussed but which provides positive-going signals at its output terminal rather than the negative signals illustrated in line (*c*) of FIGURE 2. The circuit of FIGURE 3 includes an NPN transistor Q4 corresponding to the previously discussed transistor Q1. The emitter of transistor Q4 is connected to ground and the collector thereof is connected through a resistor R6 and a capacitor C2 to the second source of reference potential. Resistor R7 is connected in parallel with resistor R6 and capacitor C2. The junction between resistor R6 and capacitor C2 is connected through resistor R8 to the base of transistor Q4. In addition, the junction is connected to the collector of an NPN transistor Q5 whose emitter is grounded and whose base is connected to the input signal source. A PNP transistor Q6 is provided whose base-emitter junction is connected across resistor R8. A resistor R9 couples the bases of transistors Q4 and Q6 to the second source of reference potential. The collector of transistor Q6 is connected through a resistor R10 to a negative source of reference potential −E.

The operation of the circuit of FIGURE 3 is substantially identical to that described for the circuit of FIGURE 1. If the transistor Q6 is of the germanium type, it is necessary to back-bias it when it is not conducting. The resistor R9, connected to the second source of reference potential, is provided to develop an excess current which flows through the resistors R9 and R8 into the capacitor C2 and which thus back-biases the transistor Q6. If transistor Q6 is of the silicon type, then resistor R9 can be deleted with resistor R6 being sufficient to supply base current to transistor Q4. As previously noted, if resistor R8 is sufficiently small, the base current passing therethrough when capacitor C2 is discharging is insufficient to turn the transistor Q6 on. Of course, when the capacitor C2 is fully discharged, the current through resistor R8 will increase and thus be sufficient to turn the transistor Q6 on. When transistor Q6 turns on, a positive-going potential will appear at the collector thereof.

From the foregoing, it should be appreciated that a circuit arrangement has been provided herein for developing a sharply rising output pulse at the end of a predetermined time interval whose duration is determined by the discharging of a capacitor. That is, the constant current provided through resistor R1 in FIGURE 1 and resistor R6 in FIGURE 3 pass into the capacitor circuit branch through the collector-emitter path of transistors Q1 and Q4, respectively, as long as the capacitors are discharging. When the capacitors are fully discharged, the constant current is diverted from the capacitive path into the resistive path substantially in parallel therewith and thence through the base-emitter junction of transistors Q1 and Q4 to ground.

It should be appreciated that the potential polarities and the types of transistors illustrated herein are exemplary only and that appropriate reversals could readily be made by those skilled in the art without departing from the spirit or scope of the invention as claimed. It is further pointed out that the capacitors can be viewed as either charging or discharging to develop the ramp voltage and indeed it should be appreciated that appropriate circuit modifications could easily be made by those skilled in the art to reverse the conditions so that the terminal value of the ramp is reached when the capacitor is fully charged or in other words when a potential exists thereacross. Likewise, the references made herein to rising and falling signals refer only to the illustrated embodiments and in fact oppositely directed signal transistions could be effected without, of course, departing from the scope of the invention.

The embodiments of the invention in which an exclusive property or privilege is claimed are defined as follows:

1. A circuit arrangement responsive to an input signal for providing an output pulse at the end of a fixed time interval, said circuit arrangement comprising:

a first transistor including a base, a collector, and an emitter;

means connecting said emitter to a first reference potential;

a first circuit branch having first and second terminals and including a capacitor;

means connecting said first circuit branch first terminal to said collector;

a second circuit branch having first and second terminals;

means connecting said second circuit branch first terminal to said base;

means for forward biasing said transistor;

current source means responsive to said transistor being forward biased for applying a substantially constant total current to said first and second circuit branches whereby a major portion of said current will initially be directed into said first circuit branch to charge said capacitor to a terminal value;

said current source means being responsive to said capacitor being charged to said terminal value for diverting a major portion of said current through said second circuit branch; and means responsive to said major portion of said current being diverted through said second circuit branch for providing said output pulse.

2. A circuit arrangement responsive to an input signal for providing an output pulse at the end of a fixed time interval, said circuit arrangement comprising:

a first transistor including a base, a collector, and an emitter;

means connecting said emitter to a first reference potential;

a first circuit branch having first and second terminals and including a capacitor;

means connecting said first circuit branch first terminal to said collector;

a second circuit branch having first and second terminals and including a first resistor;

means connecting said second circuit branch first terminal to said base;

a second resistor;

means connecting said first and second circuit branch second terminals through said second resistor to a second reference potential;

a third resistor;

means connecting said collector through said third resistor to said second source of reference potential;

an output circuit for providing said output pulse including a second transistor having a base, a collector, and an emitter; and means connecting said second transistor base-emitter junction across said first resistor.

3. The circuit arrangement of claim 2 including a transistor switch selectively actuatable to clamp said first and second circuit branch second terminals to said first reference potential.

4. The circuit arrangement of claim 2 wherein said second reference potential is more positive than said first reference potential and wherein said first transistor is of the NPN type.

5. The circuit arrangement of claim 4 wherein said second transistor is of the NPN type and said second transistor emitter is connected to said first transistor base.

6. The circuit arrangement of claim 4 wherein said second transistor is of the PNP type and said second transistor base is connected to said first transistor base.

7. A circuit arrangement for developing a ramp signal and for providing an output signal in response to said ramp signal reaching a terminal value, said circuit arrangement comprising:

a first transistor having a base, a collector and an emitter;

first and second sources of reference potential;

a capacitor having first and second terminals;

means connecting said capacitor in series with said first transistor emitter-collector path between said first and second sources of reference potential;

a resistor;

means connecting said resistor between said first transistor base and the capacitor terminal remote from said first transistor emitter-collector path;

a sensing circuit including a second transistor having a base, a collector, and an emitter; and means connecting said second transistor base-emitter junction across said resistor.

References Cited by the Examiner

UNITED STATES PATENTS

| | | | |
|---|---|---|---|
| 3,171,978 | 3/1965 | Philips et al. | 307—88.5 |
| 3,218,469 | 11/1965 | Weber | 307—88.5 |

ARTHUR GAUSS, *Primary Examiner.*

I. C. EDELL, *Assistant Examiner.*